United States Patent
Ishishita

(10) Patent No.: US 8,963,551 B2
(45) Date of Patent: Feb. 24, 2015

(54) ABNORMALITY DETECTING SYSTEM FOR BATTERY ASSEMBLY

(75) Inventor: Teruo Ishishita, Miyoshi (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 438 days.

(21) Appl. No.: 13/513,286

(22) PCT Filed: Nov. 18, 2010

(86) PCT No.: PCT/IB2010/002942
§ 371 (c)(1),
(2), (4) Date: Jun. 1, 2012

(87) PCT Pub. No.: WO2011/067646
PCT Pub. Date: Jun. 9, 2011

(65) Prior Publication Data
US 2012/0242344 A1 Sep. 27, 2012

(30) Foreign Application Priority Data
Dec. 2, 2009 (JP) .................................. 2009-274495

(51) Int. Cl.
| | | |
|---|---|---|
| G01N 27/416 | (2006.01) | |
| G01R 31/36 | (2006.01) | |
| B60L 3/00 | (2006.01) | |
| B60L 11/14 | (2006.01) | |
| H01M 10/42 | (2006.01) | |
| H01M 10/48 | (2006.01) | |
| H02J 7/00 | (2006.01) | |

(52) U.S. Cl.
CPC ........... *G01R 31/3658* (2013.01); *B60L 3/0046* (2013.01); *B60L 11/14* (2013.01);
(Continued)

(58) Field of Classification Search
CPC .......... G01R 31/3662; G01R 31/3648; G01R 31/3624; Y02E 60/12; H01M 10/48
USPC ......................................................... 324/430
See application file for complete search history.

(56) References Cited

U.S. PATENT DOCUMENTS 4,259,639 A 3/1981 Renirie
4,318,152 A * 3/1982 Weber ............................. 96/24
(Continued)

FOREIGN PATENT DOCUMENTS

| EP | 2 110 679 A1 | 10/2009 |
|---|---|---|
| JP | 2003-087991 A | 3/2003 |
| JP | 2004-014205 A | 1/2004 |
| JP | 2005-345124 A | 12/2005 |
| WO | 02/35677 A1 | 5/2002 |

OTHER PUBLICATIONS

International Search Report and Written Opinion of PCT/IB2010/002942 mailed May 11, 2011.

*Primary Examiner* — Arun Williams
(74) *Attorney, Agent, or Firm* — Kenyon & Kenyon LLP

(57) ABSTRACT

An abnormality detecting system sequentially compares the output voltages of n-piece battery cells that are connected in series, with a criteria voltage, at respective points in time $Tv1$-$Tvn$, and produces a determination signal indicative of the presence or absence of any battery cell whose voltage becomes lower than the criteria voltage at time $Tvc$. The battery current $Ib$ is sampled a predetermined number of times at intervals of a predetermined sampling cycle period $\Delta Ti$. The current sampling times $Ti1$-$Ti3$ are provided within a period that lies inside a voltage sampling period $Ta$-$Tb$ including the above-indicated times $Tv1$-$Tvn$, with a given period of time ($\Delta Ti \div 2$) or less provided at each side of the period. When detecting an increase in the internal resistance based on a comparison between the maximum value of the current sampling values and a criteria current, the abnormality detecting system corrects the criteria current in view of a current variation in a half of the sampling cycle period due to current ripple.

6 Claims, 6 Drawing Sheets

(52) U.S. Cl.
CPC ....... *G01R31/3662* (2013.01); *H01M 10/4207* (2013.01); *H01M 10/482* (2013.01); *H02J 7/0021* (2013.01); *Y02T 10/7077* (2013.01)
USPC .......................................... 324/430; 320/116

(56) References Cited

U.S. PATENT DOCUMENTS

| | | | |
|---|---|---|---|
| 5,206,578 A | 4/1993 | Nor | |
| 6,072,300 A * | 6/2000 | Tsuji | 320/116 |
| 6,404,166 B1 | 6/2002 | Puchianu | |
| 7,656,163 B2 * | 2/2010 | Yoshida | 324/429 |
| 7,859,227 B2 * | 12/2010 | Saigo | 320/136 |
| 2003/0030414 A1 | 2/2003 | Suzuki | |
| 2006/0066285 A1 | 3/2006 | Minamiura | |
| 2007/0069734 A1 | 3/2007 | Bertness | |
| 2008/0012570 A1 | 1/2008 | Bucur | |
| 2008/0036424 A1 * | 2/2008 | Saigo | 320/136 |
| 2008/0048617 A1 * | 2/2008 | Yoshida | 320/132 |
| 2008/0224709 A1 | 9/2008 | Tae | |
| 2009/0251103 A1 | 10/2009 | Yamamoto | |
| 2009/0295332 A1 * | 12/2009 | Yang et al. | 320/132 |
| 2010/0030498 A1 * | 2/2010 | Kimura et al. | 702/63 |
| 2010/0045298 A1 * | 2/2010 | Iwane et al. | 324/427 |
| 2010/0057385 A1 * | 3/2010 | Iida | 702/58 |

* cited by examiner

ABNORMALITY DETECTING SYSTEM FOR BATTERY ASSEMBLY

This is a 371 national phase application of PCT/IB2010/002942 filed 18 Nov. 2010, claiming priority to Japanese Patent Application No. 2009-274495 filed 2 Dec. 2009, the contents of which are incorporated herein by reference.

BACKGROUND OF THE INVENTION

1. Field of the Invention

The invention relates to an abnormality detecting system for a battery assembly, and more particularly to a technology of detecting an increase in the internal resistance of any battery cell in the battery assembly having a plurality of battery cells connected in series.

2. Description of the Related Art

A battery assembly in which a multiplicity of battery cells or battery modules are connected in series has been generally used. The battery assembly of this type is used in a hybrid vehicle, or the like, as a power source for driving an electric motor.

In a battery assembly as described in Japanese Patent Application Publication No. 2005-345124 (JP-A-2005-345124), an A/D converter is shared among a plurality of battery modules. In particular, JP-A-2005-345124 discloses a data collection system having first A/D converters for detecting voltage values and a second A/D converter for detecting current values, which converters are shared among a plurality of battery modules. The data collection system is arranged to operate the first A/D converters and the second A/D converter in an asynchronous mode, so as to ensure synchronism between the voltage detection values and the current detection values.

With the above arrangement, the voltage and current of the battery cells or battery modules are detected in synchronization with each other, so that the internal resistance can be correctly detected even if the battery voltage varies with current. It is thus possible to reduce the possibility of erroneously detecting an abnormality (increase) of the internal resistance.

In order to detect overcharge and over discharge for each battery cell in the battery assembly, each battery cell needs to be provided with a voltage monitoring function. In particular, when the system is arranged to be able to obtain a voltage value (analog value) for each battery cell, an abnormality (excessive increase) in the internal resistance can be detected based on a combination of the voltage value obtained for each battery cell and a current value obtained by a current sensor. With this arrangement, the data collection system as described in JP-A-2005-345124 has the A/D converters for voltage detection, each of which is shared by the battery cells or battery modules, and is operable to synchronize the current detection values and the voltage detection values.

However, if the abnormality detecting system is arranged to be able to output a voltage detection value for each battery cell, the number of sensors installed in the system and the number of signals handled by the system are increased, which may result in a complicated arrangement or construction of the abnormality detecting system, and an increased size of the system.

Accordingly, the system may be arranged to monitor the voltages of the battery cells by generating only the result of comparison between the output voltage of each battery cell and a criteria voltage as a threshold value for determining overcharge or over discharge, rather than directly handling voltage detection values. This arrangement may simplify the construction or configuration of the system.

In the meantime, how to assure sufficiently high accuracy in abnormality detection, as well as simplification of the system, is an important matter. For example, since the battery voltage varies with current, the voltage detection timing and the current detection timing need to be in synchronization with each other, so as to accurately evaluate the internal resistance of the battery. Thus, if the abnormality detecting system is simply constructed as described above, it may be difficult to detect voltage values and current values while bringing them precisely into synchronization with each other. In this case, an abnormality (excessive increase) in the internal resistance may be erroneously detected, because of an error in current detection due to loss of synchronism.

SUMMARY OF INVENTION

The invention provides an abnormality detecting system that is simply constructed to have a voltage monitoring function for each battery cell of a battery assembly, which is implemented by obtaining the result of comparison between a voltage value of each battery cell and a predetermined criteria voltage, without directly detecting the voltage value, thus making it less likely or unlikely to erroneously detect an abnormality (excessive increase) in the internal resistance.

An abnormality detecting system for a battery assembly having a plurality of battery cells connected in series according to a first aspect of the invention include a plurality of detection units, a current detector, and an abnormality monitoring circuit. The plurality of detection units are provided for the plurality of battery cells, respectively, and each of the detection units is arranged to compare an output voltage of a corresponding one of the battery cells with a predetermined criteria voltage. The current detector is provided for detecting a current that passes through the plurality of battery cells. The plurality of detection units operate sequentially in response to a start trigger, and sequentially transmit a detection signal that reflects a result of the voltage comparison, so as to output an abnormality signal indicative of whether the output voltage of any of the plurality of battery cells becomes lower than the criteria voltage. The abnormality monitoring circuit checks if an internal resistance abnormality as an increase of the internal resistance to a level larger than an upper limit thereof occurs in any of the plurality of battery cells, based on the detection signal received from the plurality of detection units and a current detection value obtained by the current detector. The abnormality monitoring circuit includes a current sampling unit, a correction amount setting unit, and a current comparing unit. The current sampling unit samples the current detection value of the current detector a predetermined number of times according to a predetermined sampling cycle. The correction amount setting unit sets a current correction amount that reflects a ripple component of the current, with respect to a criteria current corresponding to a current value obtained by dividing the criteria voltage by the upper limit of the internal resistance. The current comparing unit detects the internal resistance abnormality when the abnormality signal indicates that the output voltage of any of the plurality of battery cells becomes smaller than the criteria voltage, and when the maximum value of a plurality of current sampling values obtained by the current sampling unit is smaller than a current value obtained by subtracting the current correction amount from the criteria current. Furthermore, the current sampling unit sets the sampling cycle such that a first current sampling time is set at a point in time at which a given length of time that is equal to or less than a half of the sampling cycle period elapses from the beginning of voltage comparisons for the plurality of battery cells in the plurality of detection units, and such that a final current sampling time is set at a point in time that precedes the end of voltage comparisons in the plurality of detection units, by a given length of time that is equal to or less than the half of the sampling cycle period.

In the abnormality detecting system according to the first aspect of the invention, the correction amount setting unit may be desirably configured to set the current correction amount, according to an amount of current variation due to the ripple component, which arises from a phase shift corresponding to the half of the sampling cycle period.

In the abnormality detecting system as described above, the correction amount setting unit may be desirably configured to set the current correction amount, based on a current amplitude at the time of the maximum output of the battery assembly when the ripple component is regarded as a sinusoidal current, and a ratio of the half of the sampling cycle period to a period of the ripple component.

In the abnormality detecting system as described above, the plurality of detection units may include a first through n-th detection units (where n is an integer equal to or larger than 2). In this arrangement, the first detection unit operates in response to the start trigger, and transmits the detection signal indicative of whether the output voltage of the first battery cell becomes lower than the criteria voltage, to the second detection unit. Each of the i-th detection units (where i is an integer of 2 to n) has a voltage comparator that outputs a result of voltage comparison between the output voltage of the i-th battery cell and the criteria voltage, and a logic operation circuit configured to output the detection signal indicative of whether the output voltage of any of the first through i-th battery cells becomes lower than the criteria voltage, based on the detection signal transmitted from the (i−1)-th detection unit and an output signal of the voltage comparator. The abnormality detecting system may further include a signal transmitting circuit that receives the detection signal from the n-th detection unit, and outputs the abnormality signal based on the detection signal, to the abnormality monitoring circuit.

The abnormality detecting system according to the above aspect of the invention is simply constructed to obtain the result of comparison between a voltage value of each battery cell and a predetermined criteria voltage, without directly detecting the voltage value, so as to reduce or eliminate the possibility of erroneously detecting an abnormality (excessive increase) in the internal resistance.

BRIEF DESCRIPTION OF DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

Figure 1:
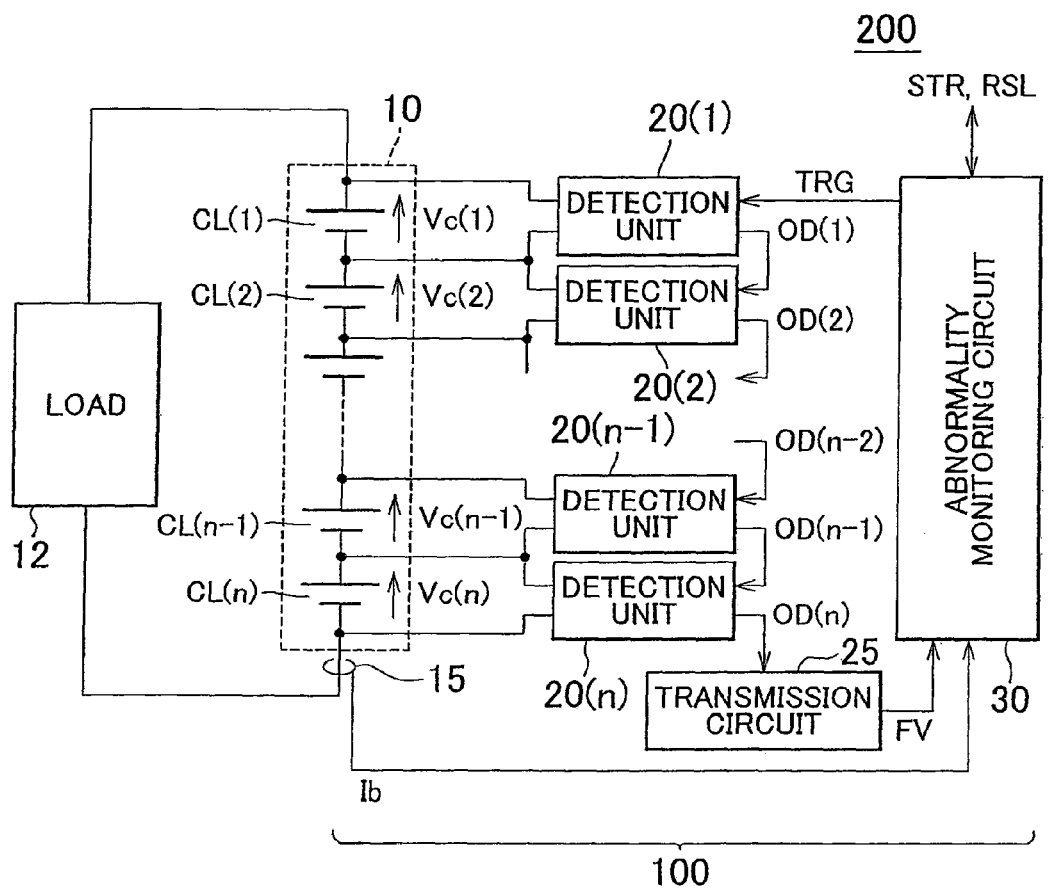
FIG. 1 is a schematic block diagram showing the construction of an electric system to which an abnormality detecting system for a battery assembly according to one embodiment of the invention is applied.

One embodiment of the invention will be described in detail with reference to the drawings. In the following, the same reference numerals are assigned to the same or corresponding portions or elements in the drawings, and the explanation of these portions or elements will not be repeated.

Referring to FIG. 1, an electric system 200 is installed on a vehicle, such as a hybrid vehicle or an electric vehicle, which has a mechanism capable of generating vehicle driving force using electric power. The electric system 200 has a battery assembly 10, an abnormality detecting system 100 for detecting an abnormality in the battery assembly 10, and a load 12.

The battery assembly 10 includes a plurality of battery cells CL(1)-CL(n) that are connected in series (n: an integer equal to or larger than 2). The battery assembly 10 supplies dc power to the load 12. Also, the battery assembly 10 is charged with dc power supplied from the load 12.

The load 12 includes a motor (not shown) and an inverter (not shown) for driving the motor. The motor is driven with electric power so as to generate driving force to vehicle wheels, and is rotated by driving force of the vehicle wheels so as to generate ac power through regenerative braking. The motor may be used for starting an engine installed on a hybrid vehicle, and/or generating electric power for charging the battery assembly 10. Also, the inverter (not shown) converts dc power received from the battery assembly 10 into ac power and supplies the ac power to the motor, or converts ac power generated by the motor into dc power and supplies the dc power to the battery assembly 10.

The abnormality detecting system 100 includes detection units 20(1)-20(n) provided respectively for battery cells CL(1)-CL(n), a transmission circuit 25, and an abnormality monitoring circuit 30.

The detection units 20(1)-20(n) receive output voltages Vc(1)-Vc(n) of the corresponding battery cells CL(1)-CL(n), respectively. The detection unit 20(1) operates in response to a start trigger TRG supplied from the abnormality monitoring circuit 30, and compares the output voltage Vc(1) of the battery cell CL(1) with a predetermined criteria voltage Vx.

Then, the detection unit 20(1) outputs a detection signal OD(1) according to the result of voltage comparison. More specifically, if the output voltage Vc(1) becomes lower than the criteria voltage Vx (Vc(1)<Vx), the detection unit 20(1) outputs a detection signal OD(1) of a logical high level (which will also be simply denoted as "H level"). On the other hand, if the output voltage Vc(1) is not lower than (i.e., is equal to or higher than) the criteria voltage Vx (Vc(1)≥Vx), the detection unit 20(1) outputs a detection signal OD(1) of a logical low level (which will also be simply denoted as "L level").

The detection unit 20(2) operates in response to the detection signal OD(1) transmitted from the detection unit 20(1) of the previous stage, and compares the output voltage Vc(2) of the battery cell CL(2) with the predetermined criteria voltage Vx. Then, the detection unit 20(2) outputs a detection signal OD(2), which is a logical OR of the voltage comparison result obtained at the detection unit 20(1) and the voltage comparison result obtained at the detection unit 20(2).

Namely, when the detection signal OD(1) is at the H level, the detection unit 20(2) outputs a H-level detection signal OD(2) even if Vc(2) is equal to or higher than Vx (Vc(2) Vx). On the other hand, when the detection signal OD(1) is at the L level, the detection unit 20(2) outputs a detection signal OD(2) according to the result of comparison of Vc(2) with the criteria voltage Vx; namely, the detection unit 20(2) outputs a H-level detection signal OD(2) when Vc(2) is lower than Vx (Vc(2)<Vx), and outputs a L-level detection signal OD(2) when Vc(2) is equal to or higher than Vx (Vc(2)≥Vx).

Figure 2:
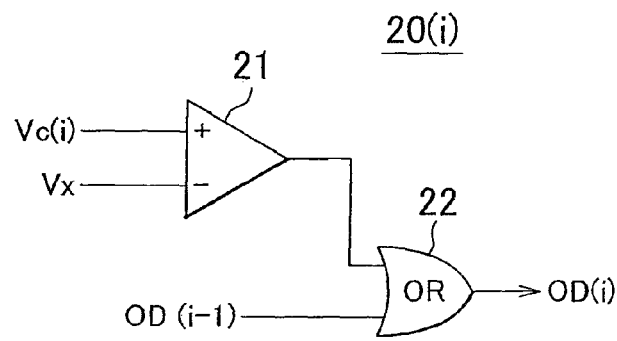
FIG. 2 is a block diagram illustrating an example of construction of a detection unit shown in FIG. 1.

The i-th detection unit 20(i) where i=2 to n is constructed as shown in FIG. 2 by way of example.

Referring to FIG. 2, the detection unit 20(i) has a voltage comparator 21, and a logical gate 22. The voltage comparator 21 compares the output voltage Vc(i) of the battery cell CL(i) corresponding to the detection unit 20(i), with the predetermined criteria voltage Vx. Then, the voltage comparator 21 sets the output voltage to the H level when Vc(i) becomes lower than Vx (Vc(i)<Vx), and sets the output voltage to the L level when Vc(i) is equal to or higher than Vx (Vc(i)≥Vx).

The logical gate 22 outputs an OR operation result that is a logical OR of the output signal of the voltage comparator 21 and the detection signal OD(i−1) received from the detection unit 20(i−1) of the previous stage, as a detection signal OD(i).

Referring again to FIG. 1, the detection signal OD (which generically denotes the detection signals OD(1)-OD(n)) that reflects the voltage comparison result obtained at each detection unit 20 (which generically denotes the detection units 20(1)-20(n)) is successively transmitted to the detection unit 20 of the next stage while the detection units 20 perform OR operations. As a result, the detection units 20(1)-20(n) operate sequentially in response to the start trigger TRG.

Since the operating time of each detection unit 20 is the same, the output voltages Vc(1)-Vc(n) of the corresponding battery cells CL(1)-CL(n) are sequentially compared with the criteria voltage Vx in a fixed cycle or at fixed intervals. The detection signal OD(n) generated by the detection unit 20(n) of the final stage is a signal indicative of whether there is any battery cell of which the output voltage becomes lower than the criteria voltage Vx, through a series of voltage comparisons between the output voltages of the battery cells CL(1)-CL(n) and the criteria voltage Vx, in response to the start trigger TRG. For example, the detection signal OD(n) is a one-bit digital signal.

The transmission circuit 25 receives the detection signal OD(n) generated by the detection unit 20(n) of the final stage, and produces a final determination signal FV, using a photo-coupler, or the like, for insulation. Namely, the determination signal FV is produced in response to the start trigger TRG, and is transmitted to the abnormality monitoring circuit 30. As described above, the determination signal FV indicates whether an abnormality (which will also be called "cell voltage reduction abnormality") that the output voltage of any of the battery cells CL(1) to CL(n) becomes lower than the criteria voltage Vx occurs or not. More specifically, if the output voltage of any of the battery cells CL(1)-CL(n) becomes lower than the criteria voltage Vx, the determination signal FV is set to the H level. On the other hand, if the output voltages of all of the battery cells CL(1)-CL(n) do not fall below (i.e., are equal to or higher than) the criteria voltage Vx, the determination signal FV is set to the L level.

The current sensor 15 detects battery current Ib as a current that passes through the battery assembly 10. Since the battery cells CL(1)-CL(n) are connected in series, the battery current Ib is common to the battery cells CL(1)-CL(n). A current value of the battery current Ib can be obtained by means of the current sensor 15. In the meantime, the abnormality detecting system 100 is not provided with voltage sensors for detecting voltage values of the output voltages Vc(1)-Vc(n) of the battery cells CL(1)-CL(n), but deals with only the results of comparisons between the output voltages Vc(1)-Vc(n) and the criteria voltage Vx. It will be thus understood that the abnormality detecting system 100 has a simple arrangement in which voltage sensors for detecting voltage values (analog values) of a multiplicity of battery cells CL(1)-CL(n) are not provided, in connection with voltage monitoring for each battery cell.

The abnormality monitoring circuit 30 executes an abnormality detecting operation for detecting an abnormality in the battery cells CL(1)-CL(n), in response to a start command signal STR from an ECU (Electronic Control Unit). Namely, the abnormality monitoring circuit 30 produces a start trigger TRG to be transmitted to the detection unit 20(1), in response to the start command signal STR.

Furthermore, the abnormality monitoring circuit 30 determines whether an excessive increase in the internal resistance (which will also be simply called "internal resistance abnormality") occurs when the above-mentioned voltage reduction abnormality occurs, based on the determination signal FV sent back to the circuit 30 in response to the start trigger TRG, and sampling values of the output of the current sensor 15.

Then, the abnormality monitoring circuit 30 outputs a signal RSL indicative of abnormality detection results including at least the detection results concerning cell voltage reduction abnormality and internal resistance abnormality of the battery cells CL(1)-CL(n), to the ECU.

The abnormality detecting system may be further provided with voltage abnormality detection units (which are not shown in the drawings since they are not directly related to detection of an internal resistance abnormality in this embodiment) which determine whether the output voltage Vc(1)-Vc(n) of each battery cell exceeds an upper-limit voltage (that is higher than the criteria voltage Vx). In this case, the voltage abnormality detection unit (not shown) is provided for each of the battery cells, and the detection units may be arranged to operate sequentially in response to a start trigger TRG, compare the output voltages of the corresponding battery cells with the upper-limit voltage, and transmit upper-limit voltage comparison signals that reflect the voltage comparison results successively to the following detection units, so as to output a voltage abnormality signal indicative of whether the output voltage of any of the battery cells is higher than the upper-limit voltage. Thus, the abnormality detection system 100 may be arranged to be able to check if there is a voltage abnormality due to excessive charging with respect to each of the battery cells CL(1)-CL(n).

Next, detection of an internal resistance abnormality by the abnormality monitoring circuit 30 will be described in detail. In this connection, the abnormality monitoring circuit 30 may consist of a microcomputer, such as an integrated circuit (IC), and is configured to perform an abnormality detecting operation as explained below, through software processing implemented by executing a pre-stored program(s), and/or hardware processing implemented by a dedicated electronic circuit (not shown) prepared in advance.

Figure 3:
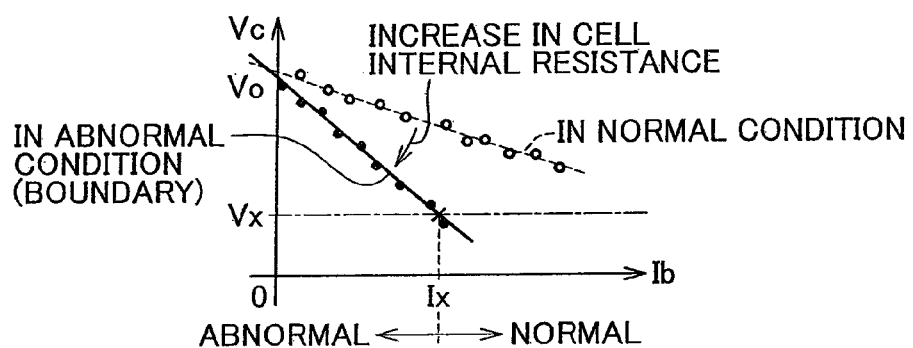
FIG. 3 is a conceptual view useful for explaining a method of detecting an internal resistance abnormality by an abnormality monitoring circuit of the embodiment of FIG. 1.

Referring to FIG. 3, the internal resistance of the battery cell can be detected by observing a voltage drop from an open-circuit voltage Vo, which occurs according to the battery current Ib. Namely, as the battery current Ib increases, the output voltage Vc of the battery cell decreases along a slope corresponding to the internal resistance.

If the internal resistance of the battery cell increases, the slope or gradient (negative value) of a straight line representing the relationship of Ib and Vc as shown in FIG. 3 becomes steeper, and the output voltage Vc at the same battery current Ib is reduced. By determining boundary values of the internal resistance corresponding to threshold values based on which an internal resistance abnormality is detected, it is possible to obtain a current Ix that appears when the output voltage Vc is equal to Vx with the internal resistance being equal to the boundary value.

The thus obtained current Ix is compared with the battery current Ib when the output voltage of any of the battery cells CL(1)-CL(n) becomes lower than the criteria voltage Vx; thus, the current Ix serves as a criteria current based on which an internal resistance abnormality is detected. Namely, when a cell voltage reduction abnormality is detected, an internal resistance abnormality is detected if the battery current Ib is smaller than Ix (Ib<Ix), whereas no internal resistance abnormality is detected if Ib is equal to or larger than Ix (Ib≧Ix). Thus, the abnormality detecting system 100 can determine the presence or absence of an internal resistance abnormality in its abnormality detecting operation, even through the system 100 has no voltage sensor for obtaining an output voltage value of each battery cell.

Even with the above arrangement, since the output voltage Vc varies with the battery current Ib, it is desirable to compare the battery current Ib at the time when the cell voltage reduction abnormality occurs, with the criteria current Ix, so as to determine the presence of an internal resistance abnormality through comparison between the battery current Ib and the criteria current Ix, without using any voltage value.

Here, the battery current Ib to be compared with the criteria current Ix is obtained by the abnormality monitoring circuit 30 that samples the output value of the current sensor 15. Accordingly, if there is a time difference or lag between a point in time at which a cell voltage reduction abnormality is detected and a point in time at which the battery current Ib is sampled, an internal resistance abnormality may not be accurately detected due to the time lag. In particular, an internal resistance abnormality may be erroneously detected when the battery current Ib detected has an extremely small value.

In the meantime, if the abnormality monitoring circuit 30 is arranged to sample the output value of the current sensor 15 in accordance with the operating cycle of the detection units 20(1)-20(n), not only a high-speed current sampling operation is required, but also the abnormality monitoring circuit 30 needs to receive the detection signals OD(1)-OD(n) from the respective detection units 20(1)-20(n), resulting in a complicated arrangement due to an increase in the number of input and output signal lines, and an increase in the cost of the system. Accordingly, the abnormality detecting system 100 of this embodiment having a simplified arrangement employs a detection method as described below, so as to reduce the possibility of erroneously detecting an internal resistance abnormality, while avoiding high-speed current sampling.

Figure 4:
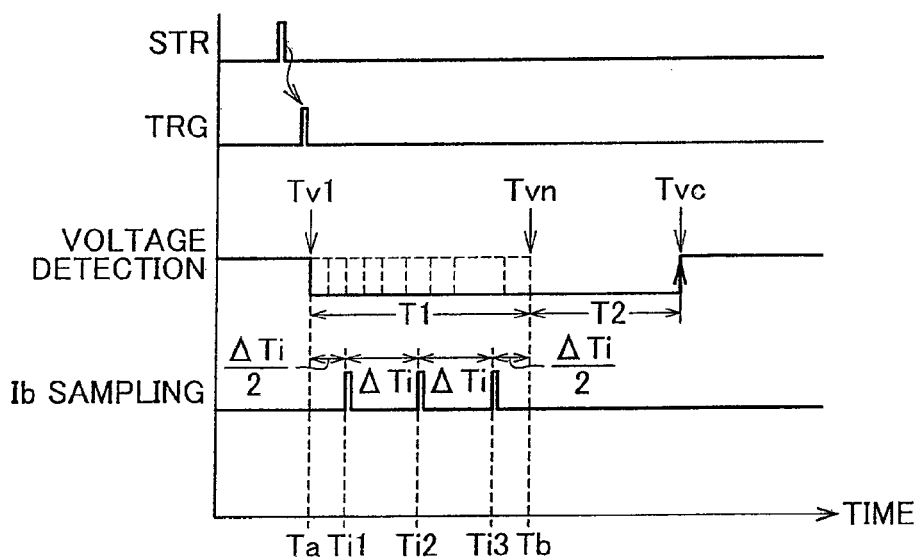
FIG. 4 is a timing chart useful for explaining a method of detecting an internal resistance abnormality in battery cells, in the abnormality detecting system for the battery assembly according to the embodiment of FIG. 1.

Referring to FIG. 4, an abnormality detecting operation (one set) for detecting an abnormality in the battery cells CL(1)-CL(n) is started when a start command signal STR is supplied from the ECU to the abnormality monitoring circuit 30.

The abnormality monitoring circuit 30 generates a start trigger TRG in response to the start command signal STR. As explained above with reference to FIG. 1, the detection units 20(1)-20(n) operate sequentially in response to the start trigger TRG. Then, the output voltages of the battery cells CL(1)-CL(n) are compared with the criteria voltage Vx at respective points in time between time Tv1 and time Tvn. Namely, the points in time Tv1, Tv2, . . . Tvn correspond to the voltage sampling timing of sampling the voltages of the respective detection units 20(1)-20(n).

After the detection unit 20(n) completes the voltage comparison at time Tvn, the determination signal FV reaches the abnormality monitoring circuit 30 at time Tvc, via the transmission circuit 25. The required period of time T1 between time Tv1 and time Tvn corresponds to the operating time of the detection units 20(1)-20(n) and the transmission time of the detection signals OD(1)-OD(n−1). Also, the required period of time T2 between time Tvn and time Tvc corresponds to the time (including, for example, a delay in transmission caused by the photocoupler) required at the transmission circuit 25.

With the abnormality detecting system 100 of this embodiment constructed as described above, the abnormality monitoring circuit 30 cannot directly grasp the respective points in time Tv1-Tvn. However, the required periods of time T1, T2 as described above can be grasped in advance. Accordingly, a period Ta-Tb (which will also be called "voltage sampling period") for which voltage sampling is supposed to be carried out can be set, based on the timing of generation of the start trigger TRG.

Current sampling is repeatedly executed a given number of times in a sampling cycle of $\Delta Ti$ (i.e., at regular intervals of $\Delta Ti$), during the above-described voltage sampling period Ta-Tb. In the example of FIG. 4, the given number of times is three times, and the current sampling is executed at points in time Ti1, Ti2, Ti3 in the sampling cycle of $\Delta Ti$. The initial current sampling time Ti1 is set with a time lag of $(\Delta Ti/2)$ or less from the start time Ta of the voltage sampling period. For example, Ti1 is set at a point in time that is later than Ta by $(\Delta Ti/2)$. Also, the final current sampling time T13 is provided such that the length of time between Ti3 and Tb at which the voltage sampling period ends is equal to or shorter than $(\Delta Ti/2)$. For example, Ti3 is set to a point in time that is earlier than Tb by $(\Delta Ti/2)$.

By appropriately setting the sampling cycle $\Delta Ti$ and the relationship between the initial current sampling time (time Ti1) and the starting time (time Ta) of the voltage sampling period, the current sampling times Ti1, Ti2, Ti3 are set within a period that lies inside the voltage sampling period Ta-Tb with a given time of $\Delta Ti/2$ or less provided at each side of the current sampling period Ti1-Ti3.

Figure 5:
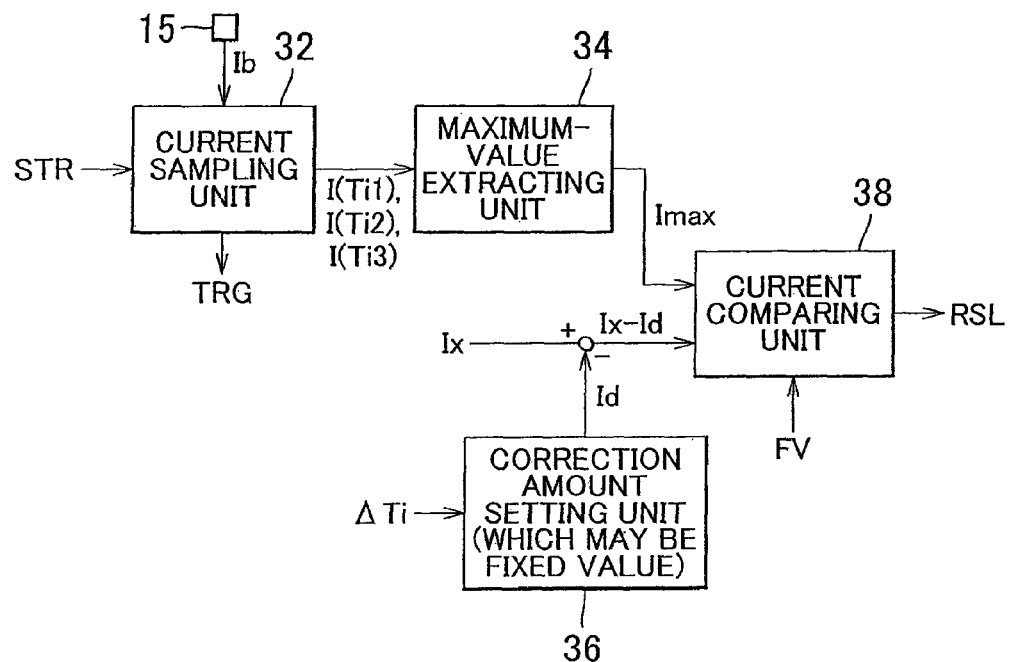
FIG. 5 is a functional block diagram showing the functions of the abnormality monitoring circuit of the embodiment of FIG. 1, for implementing the method of detecting an internal resistance abnormality.

The function of each block shown in FIG. 5 is implemented through software processing by the abnormality monitoring circuit 30 and/or hardware processing.

Referring to FIG. 5, the abnormality monitoring circuit 30 includes a current sampling unit 32, a maximum-value extracting unit 32, a correction amount setting unit 36, and a current comparing unit 38.

Upon receipt of a start command signal STR, the current sampling unit 32 produces a start trigger TRG, and performs sampling of the battery current Ib detected by the current sensor 15, in a predetermined sampling cycle of $\Delta Ti$ (or at intervals of $\Delta Ti$), according to the timing as shown in FIG. 4. As a result, current sampling values I(Ti1), I(Ti2), I(Ti3) are obtained, as shown in FIG. 4. The maximum-value extracting unit 34 extracts the maximum value of the current sampling values I(Ti1)-I(Ti3) obtained by the current sampling unit 32, and outputs the maximum current Imax.

The correction amount setting unit 36 sets a correction current Id for the criteria current Ix as shown in FIG. 3. The correction current Id is supposed to be the maximum value of the amount of change of current, which change is caused by a time lag between detection of a cell voltage reduction abnormality and sampling of the battery current Ib, as described above, due to a ripple component of the battery current Ib. Then, the current comparing unit 38 receives a current value (Ix-Id) obtained by correcting the original criteria current Ix (FIG. 3) using the correction current Id.

When the determination signal FV is set to the H level, namely, when the output voltage of any of the battery cells becomes lower than the criteria voltage Vx, the current comparing unit 38 outputs an abnormality signal indicative of the presence or absence of an internal resistance abnormality, as a signal RSL.

The current comparing unit 38 compares the maximum current Imax received from the maximum-value extracting unit 34, with the corrected criteria current (Ix-Id). If Imax is smaller than (Ix-Id) (Imax<(Ix-Id)), the current comparing unit 38 detects an internal resistance abnormality, and sets an internal resistance abnormality signal to a H level. On the other hand, if Imax is equal to or larger than (Ix-Id) (Imax≥(Ix-Id)), the current comparing unit 38 sets the internal resistance abnormality signal to a L level, which means that no internal resistance abnormality is detected.

A manner of setting the correction current Id will be described with reference to FIG. 6. As described above, the correction current Id is set so as to cope with a current ripple (ac component) of the battery current Ib.

Figure 6:
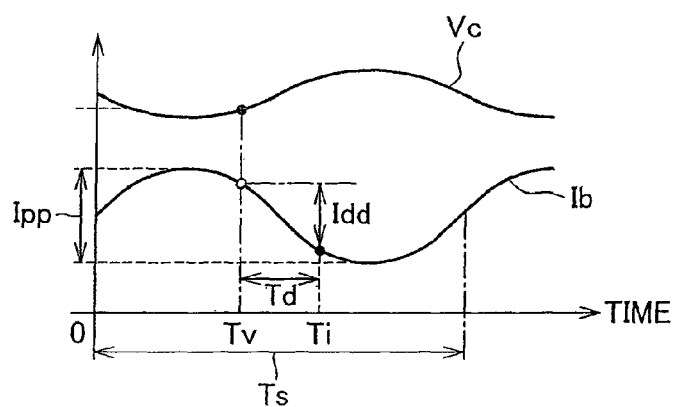
FIG. 6 is a conceptual view useful for explaining a current variation that arises due to an influence of current ripple, which is caused by a time lag between the voltage detection timing and the current detection timing, in the embodiment of FIG. 1 of the invention.

Referring to FIG. 6, suppose Vc<Vx is detected at time Tv in a condition where the output voltage Vc of the battery cell varies due to a ripple component of the battery current Ib. Namely, a cell voltage reduction abnormality is detected at time Tv.

In the meantime, the current sampling timing Ti is set according to the predetermined sampling cycle $\Delta Ti$, irrespective of the above-indicated time Tv. Accordingly, there is a detection lag Td between the time Tv at which the voltage is detected, and the time T1 at which the current is detected. Owing to the detection lag Td, a current variation Idd arises from a phase difference in the current ripple.

Assuming that the ripple component of the battery current Ib is in the form of sinusoidal current, it would be understood that the current variation Idd due to the detection lag Td is expressed by the following equation (1).

$$Idd = Ipp \cdot \sin(\pi - (Td/Ts) \cdot \pi) \quad (1)$$

In the above equation (1), Ipp corresponds to a peak-to-peak value (double the amplitude) of the current ripple assumed to be sinusoidal current, and Ts corresponds to the period of the current ripple.

The current variation Idd may take a positive value or a negative value, depending upon the phase of the current detection timing Ti. In this embodiment, however, only the current variations Idd that occur when an excessively small current is detected may be taken into consideration, since the object of the embodiment is to reduce the possibility of erroneously detecting an abnormality that the internal resistance increases to be larger than a threshold value. From this point of view, how the maximum value of the current variation Idd is set in the above-indicated equation (1) will be described in detail.

In one abnormality detecting operation, the current sampling is executed three times at points in time Ti1, Ti2, Ti3, as shown in FIG. 4. Meanwhile, the voltage comparisons for the battery cells CL(1)-CL(n) are effected between time Ta and time Tb.

Accordingly, the voltage detecting timing Tv in FIG. 6, at which a cell voltage reduction abnormality is detected as a result of comparison between the output voltage of the battery cell and the criteria voltage, exists at some point between time Ta and time Tb as the voltage sampling period.

Consequently, it will be understood that the maximum value of the time lag between the voltage detection timing Tv and the current sampling timing Ti is a half ($\Delta Ti/2$) of the sampling cycle period. Accordingly, the correction current Id for the criteria current Ix can be set by substituting Td=($\Delta Ti/2$) into the above-indicated equation (1).

The peak-to-peak value Ipp of the current ripple and the period Ts in the above equation (1) vary depending on the rotational speed or power of the motor (which provides the load 12) for generating vehicle driving force. Accordingly, the peak-to-peak value Ipp may be set so as to correspond with the vehicle-speed range or power range expected to be covered by each vehicle, and correspond with the amplitude of the maximum current ripple that can be generated. Similarly, the period Ts of current ripple may be set for each vehicle. Namely, the correction current Id set according to the above equation (1) can be determined in advance, depending on the specifications of the load (typically, a motor for driving a vehicle) of the battery assembly 10 or its control specifications, for each type of vehicle.

Taking it into consideration that the correction current Id serves to reduce the criteria current Ix so as to reduce the possibility of erroneously detecting an internal resistance abnormality, the maximum value of Ipp and the minimum value of Ts, which can be conceived in view of the specifications of the load (motor), are applied to the above equation (1), so that the correction current Id assumes a fixed value for each type or specification of vehicle.

Alternatively, the peak-to-peak value Ipp and period Ts of the current ripple may be varied in accordance with vehicle conditions, more specifically, the rotational speed and output value of the motor, and then applied to the above equation (1), so that the correction current Id is set to a variable value that varies depending on the vehicle conditions.

In the abnormality detecting system 100 of this embodiment, an internal resistance abnormality is detected when the maximum value (the maximum current Imax) of the current sampling values I(Ti1)-I(Ti3) obtained at points in time Ti1-Ti3 is smaller than the corrected criteria current (Ix-Id). With regard to a current variation Idd relative to the maximum current Imax, a half ($\Delta Ti/2$) of the sampling cycle period, which is the maximum value of detection lag, is substituted for Td in the above equation (1), so that the current variation Idd that appears when the influence of current ripple is estimated at the maximum can be calculated. This is because the current sampling times are provided within the period that lies inside the voltage sampling period Ta-Tb with a given time of ($\Delta Ti/2$) or less provided at each side of the current sampling period, as shown in FIG. 4, so that, even when a cell voltage reduction abnormality is detected at any of the times Tv 1-Tvn, a time difference or lag between the voltage detection time (Tv in FIG. 6) and the current sampling time immediately before or after the voltage detection time is always equal to or smaller than ($\Delta Ti/2$).

The criteria current to be compared with the maximum current Imax can be corrected so that it reflects the correction current Id corresponding to the current variation as described above. Thus, the possibility of erroneously detecting an increase in the internal resistance is reduced or eliminated which would otherwise arise when an excessively small current value is detected due to an influence of current ripple, which is caused by a lag between the voltage detection timing and the current detection timing.

Next, detection of an internal resistance abnormality by the abnormality detection system for the battery assembly according to this embodiment of the invention will be explained with reference to a flowchart that illustrates a control routine implemented by the abnormality monitoring circuit 30.

Figure 7:
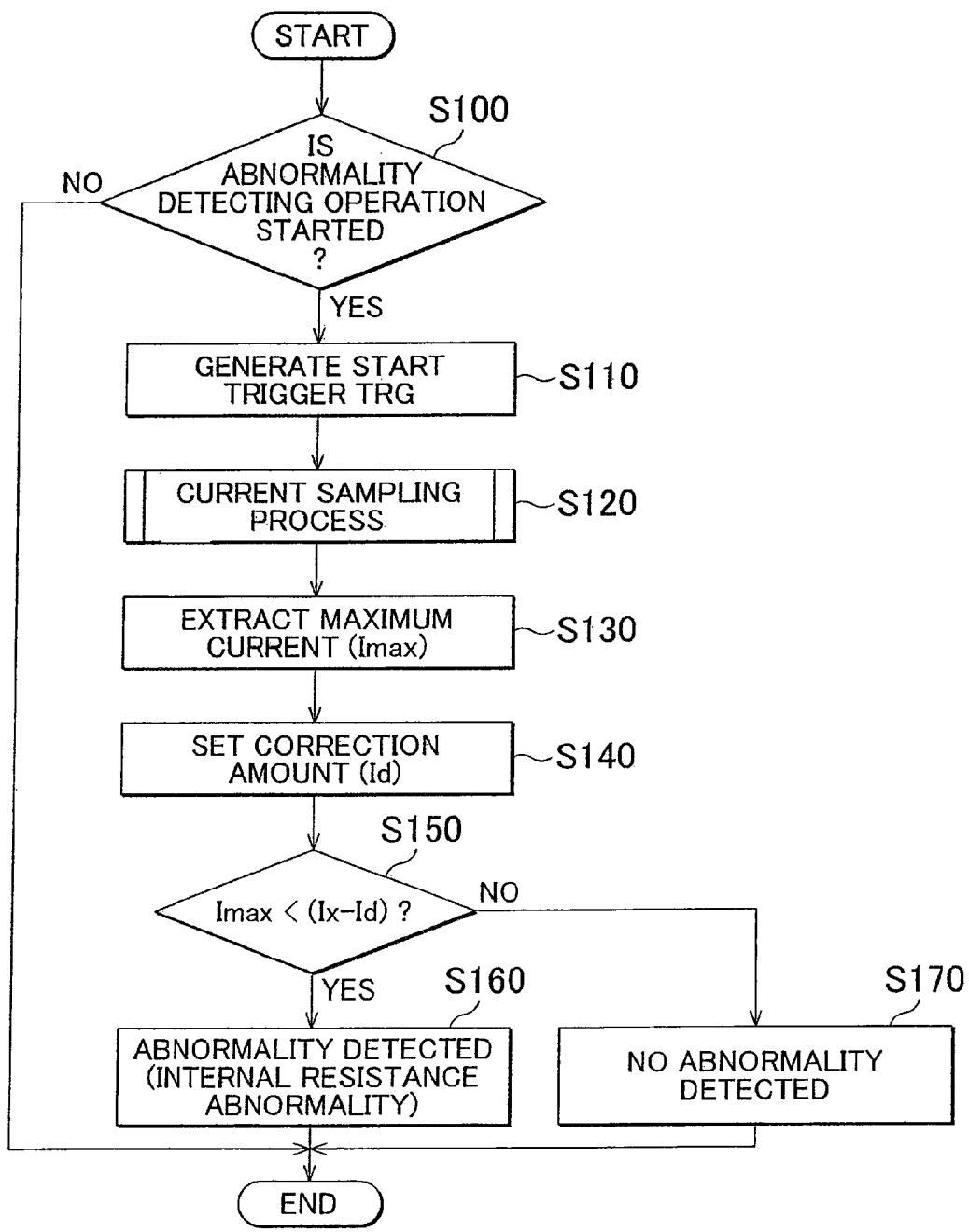
FIG. 7 is a flowchart illustrating a control routine for detecting an internal resistance abnormality, which is executed by the abnormality detecting system for the battery assembly according to the embodiment of FIG. 1 of the invention.

Referring to FIG. 7, the abnormality monitoring circuit 30 determines in step S100 whether an abnormality detecting operation for detecting an internal resistance abnormality is started. In step S100, it is determined whether a start command signal STR is generated from the ECU, for example. When the start command signal STR is not generated, the process of the following steps S110-S170 is not carried out.

If the start command signal STR is generated, on the other hand, an affirmative decision (YES) is made in step S100, and the control proceeds to step S110. In step S110, the abnormality monitoring circuit 30 generates a start trigger TRG to the detection unit 20(1). In response to the start trigger TRG, the detection units 20(1)-20(n) operate sequentially so as to compare the output voltages of the battery cells CL(1) CL(n) with the criteria voltage Vx one after another.

Further, the abnormality monitoring circuit 30 executes a current sampling process in step S120 in which current is sampled each time the sampling cycle period $\Delta Ti$ elapses. In step S120, current sampling values are obtained by sampling the output value of the current sensor 15 at respective sampling times.

Figure 8:
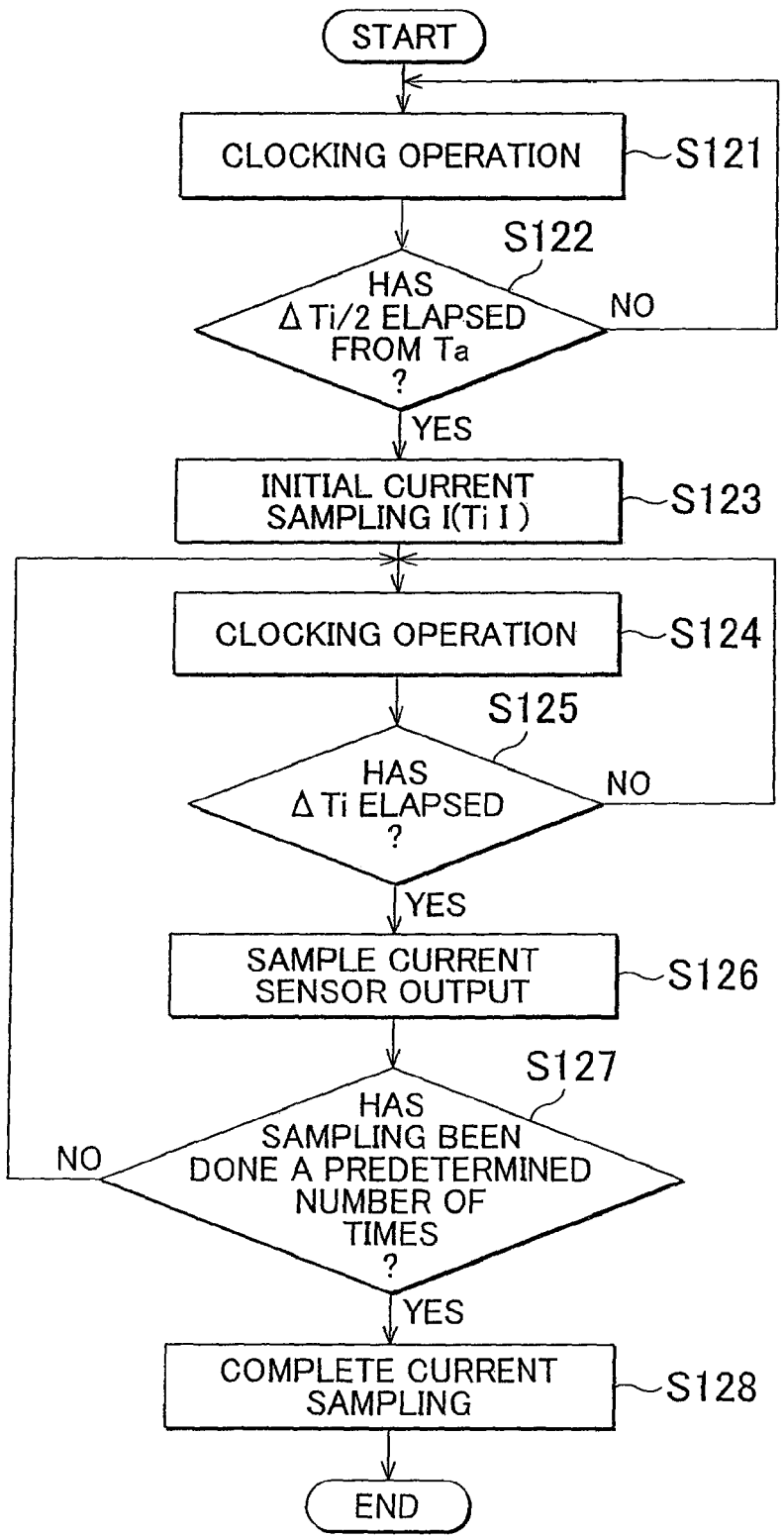
FIG. 8 is a flowchart illustrating a detailed control routine of a current sampling process shown in FIG. 7.

Referring to FIG. 8, in the current sampling process, the abnormality monitoring circuit 30 performs a clocking or time measuring operation in step S121, and determines in step S122 whether a predetermined time, typically, a half ($\Delta Ti/2$) of the sampling cycle period has elapsed from time Ta (the beginning of the voltage sampling period). The abnormality monitoring circuit 30 repeats the clocking operation of step S121 until ($\Delta Ti/2$) elapses (when a negative decision (NO) is made in step S122).

Upon a lapse of the predetermined time (($\Delta Ti/2$ in this embodiment), an affirmative decision (YES) is made in step S122, and the abnormality monitoring circuit 30 proceeds to step S123 in which the initial current sampling is executed. As a result, the output value of the current sensor 15 is sampled, so that the current sampling value I(Ti1) is obtained.

In step S124, the abnormality monitoring circuit 30 performs a clocking operation to measure the time lapsed from the last or previous current sampling time. Then, the abnormality monitoring circuit 30 determines in step S125 whether the sampling cycle period $\Delta Ti$ has elapsed from the last current sampling. The abnormality monitoring circuit 30 repeats the clocking operation of step S124 until the sampling cycle period $\Delta Ti$ elapses (when a negative decision (NO) is made in step S125).

If the sampling cycle period $\Delta Ti$ elapses from the last current sampling (when an affirmative decision (YES) is made in step S125), the abnormality monitoring circuit 30 proceeds to step S126 in which the output value of the current sensor 15 is sampled. After the current sampling (S126) is performed, the abnormality monitoring circuit 30 proceeds to step S127 to determine whether the current sampling has been carried out a predetermined number of times. If the current sampling has been carried out the predetermined number of times (if an affirmative decision (YES) is made in step S127), the abnormality monitoring circuit 30 proceeds to step S128 to complete the current sampling process. If the current sampling has not been carried out the predetermined number of times (if a negative decision (NO) is made in step S127), the abnormality monitoring circuit 30 repeats the process of steps S124-S127 so as to execute current sampling according to the sampling cycle $\Delta Ti$. In this manner, current sampling is carried out at each of the times Ti1-Ti3 as shown in FIG. 4.

Referring back to FIG. 7, once the current sampling process is completed in step S120, the abnormality monitoring circuit 30 proceeds to step S130 to extract the maximum current Imax as the maximum value of a plurality of current sampling values obtained in step S120. In the example as explained above, the current sampling is carried out three times for each abnormality detecting operation; therefore, the maximum value of the current sampling values I(Ti1)-I(Ti3) is set as the maximum current Imax.

In step S140, the abnormality monitoring circuit 30 sets a correction amount Id for the criteria current Ix. As explained above with reference to FIG. 6, the correction amount Id set in step S140 is set by substituting ($\Delta Ti/2$) for Td in the above equation (1) (i.e., Td=($\Delta Ti/2$)), so as to cover current variations due to current ripple when the detection lag Td shown in FIG. 6 is at the maximum ($\Delta Ti/2$).

When the abnormality monitoring circuit 30 detects a cell voltage reduction abnormality based on the determination signal FV, the circuit 30 determines whether an internal resistance abnormality occurs, by comparing the maximum current Imax obtained in step S130 with the corrected criteria current (Ix-Id).

When Imax is smaller than (Ix-Id) (i.e., when an affirmative decision (YES) is made in step S150), the abnormality monitoring circuit 30 proceeds to step 160 to determine that the internal resistance has increased to be larger than the threshold value in any of the battery cells, namely, that an internal resistance abnormality occurs, and outputs a detection result that "ABNORMALITY DETECTED". When Imax is equal to or larger than (Ix-Id) (when a negative decision (NO) is made in step S150), on the other hand, the abnormality monitoring circuit 30 proceeds to step S170 to determine that no internal resistance abnormality occurs, and outputs a detection result that "NO ABNORMALITY DETECTED". When the determination signal FV indicates that no cell voltage reduction abnormality is detected, a negative decision (NO) is made in step S150, and it is determined that no internal resistance abnormality occurs.

While the abnormality detecting system for the battery assembly according to this embodiment is simply constructed not to directly detect a voltage value of each battery cell as a voltage monitoring function for each battery cell, the system is able to determine whether the internal resistance has increased to be greater than a predetermined level (whether there is an internal resistance abnormality), while reducing or eliminating the possibility of erroneous detection due to a lag between the sampling timing of the output of the current sensor 15 and the voltage detection timing.

While the current sampling is conducted three times in one abnormality detecting operation, the number of times of current sampling may be set to any number provided that it is equal to or larger than three.

Figure 9:
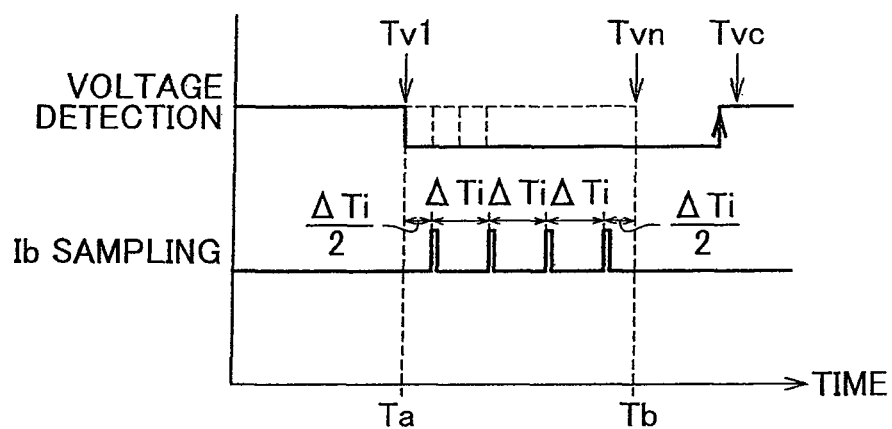
FIG. 9 is a timing chart similar to that of FIG. 4, as a modified example of the embodiment of FIG. 1 of the invention.

For example, FIG. 9 shows a modified example in which the current sampling is conducted four times in one abnormality detecting operation. In the modified example of FIG. 9, the current sampling times Ti1-Ti4 are set at intervals of the sampling cycle period $\Delta Ti$, between a point in time at which a half ($\Delta Ti/2$) of the sampling cycle period elapses from the beginning (Ta) of the voltage sampling period, and a point in time that precedes the end (Tb) of the voltage sampling period by ($\Delta Ti/2$), so that an internal resistance abnormality can be detected with a reduced possibility of erroneous detection due to a lag between voltage detection timing and current detection timing, by an abnormality detecting method similar to that of the illustrated embodiment, namely, by comparing the maximum current of a plurality of current sampling values with the corrected criteria current (Ix-Id).

Figure 10:
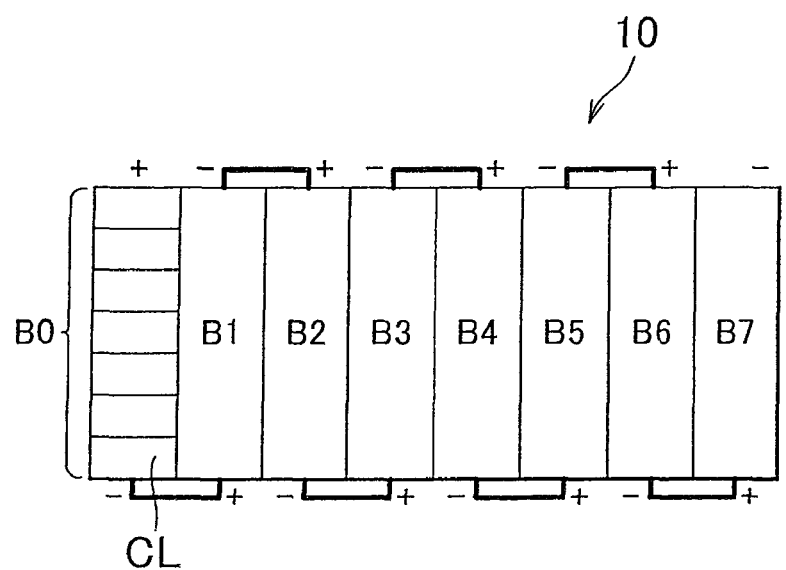
FIG. 10 is a block diagram showing another example of construction of a battery assembly to which the abnormality detecting system for the battery assembly according to the embodiment of FIG. 1 of the invention is applied.

As shown in FIG. 10, the battery assembly 10 as shown in FIG. 1 may be regarded as one battery block, and a plurality of such battery blocks (B0-B7) may be combined together, to provide a battery assembly 10 as shown in FIG. 10.

The invention claimed is:

1. An abnormality detecting system for a battery assembly having a plurality of battery cells connected in series, comprising:
a plurality of detection units provided for the plurality of battery cells, respectively, each of the detection units being arranged to compare an output voltage of a corresponding one of the battery cells with a predetermined criteria voltage, the plurality of detection units operating sequentially in response to a start trigger, and sequentially transmitting a detection signal that reflects a result of the voltage comparison, so as to output an abnormality signal indicative of whether the output voltage of any of the plurality of battery cells becomes lower than the criteria voltage;
a current detector that detects a current that passes through the plurality of battery cells; and
an abnormality monitoring circuit that checks if an internal resistance abnormality as an increase of the internal resistance to a level larger than an upper limit thereof occurs in any of the plurality of battery cells, based on the detection signal received from the plurality of detection units and a current detection value obtained by the current detector,
wherein the abnormality monitoring circuit comprises:
a current sampling unit that samples the current detection value of the current detector a predetermined number of times according to a predetermined sampling cycle;
a correction amount setting unit that sets a current correction amount that reflects a ripple component of the current, with respect to a criteria current corresponding to a current value obtained by dividing the criteria voltage by the upper limit of the internal resistance; and
a current comparing unit that detects the internal resistance abnormality when the abnormality signal indicates that the output voltage of any of the plurality of battery cells becomes smaller than the criteria voltage, and when the maximum value of a plurality of current sampling values obtained by the current sampling unit is smaller than a current value obtained by subtracting the current correction amount from the criteria current, and
wherein the current sampling unit sets the sampling cycle such that a first current sampling time is set at a point in time at which a given length of time that is equal to or less than a half of the sampling cycle period elapses from the beginning of voltage comparisons for the plurality of battery cells in the plurality of detection units, and such that a final current sampling time is set at a point in time that precedes the end of voltage comparisons in the plurality of detection units, by a given length of time that is equal to or less than the half of the sampling cycle period.

2. The abnormality detecting system for the battery assembly according to claim 1, wherein the correction amount setting unit is configured to set the current correction amount, according to an amount of current variation due to the ripple component, which arises from a phase shift corresponding to the half of the sampling cycle period.

3. The abnormality detecting system for the battery assembly according to claim 2, wherein the correction amount setting unit is configured to set the current correction amount, based on a current amplitude at the time of the maximum output of the battery assembly when the ripple component is regarded as a sinusoidal current, and a ratio of the half of the sampling cycle period to a period of the ripple component.

4. The abnormality detecting system for the battery assembly according to claim 1, wherein the detection signal received by the abnormality monitoring circuit is an abnormality signal produced based on the detection signal generated by the detection unit of a final stage as one of the plurality of detection units.

5. The abnormality detecting system for the battery assembly according to claim 1, wherein the plurality of detection units include a first through n-th detection units where n is an integer equal to or larger than 2, the first detection unit operating in response to the start trigger, and transmitting the detection signal indicative of whether the output voltage of the first battery cell becomes lower than the criteria voltage, to the second detection unit, each of the i-th detection units, where i is an integer of 2 to n, including a voltage comparator that outputs a result of voltage comparison between the output voltage of the i-th battery cell and the criteria voltage, and a logic operation circuit configured to output the detection signal indicative of whether the output voltage of any of the first through i-th battery cells becomes lower than the criteria voltage, based on the detection signal transmitted from the (i−1)-th detection unit and an output signal of the voltage comparator,
the abnormality detecting system further comprising a signal transmitting circuit that receives the detection signal from the n-th detection unit, and outputs the abnormality signal based on the detection signal, to the abnormality monitoring circuit.

6. The abnormality detecting system for the battery assembly according to claim 1, further comprising a plurality of voltage abnormality detection units provided for the plurality of battery cells, respectively, each of the voltage abnormality detection units operating sequentially in response to a start trigger, comparing the output voltage of a corresponding one of the battery cells with an upper-limit voltage that is higher than the criteria voltage, and sequentially transmitting an upper-limit voltage comparison signal that reflects a result of the voltage comparison, so as to output a voltage abnormality signal indicative of whether the output voltage of any of the plurality of battery cells is higher than the upper-limit voltage.

* * * * *